United States Patent
Whitfield et al.

(10) Patent No.: US 8,252,656 B2
(45) Date of Patent: Aug. 28, 2012

(54) ZENER TRIGGERED ESD PROTECTION

(75) Inventors: James D. Whitfield, Gilbert, AZ (US); Changsoo Hong, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 571 days.

(21) Appl. No.: 12/415,017

(22) Filed: Mar. 31, 2009

(65) Prior Publication Data

US 2010/0244088 A1 Sep. 30, 2010

(51) Int. Cl.
*H01L 21/8222* (2006.01)
*H01L 21/426* (2006.01)

(52) U.S. Cl. .. 438/328; 438/527; 438/983; 257/E21.356

(58) Field of Classification Search .................. 438/328, 438/527, 983; 257/E21.356
See application file for complete search history.

(56) References Cited

U.S. PATENT DOCUMENTS

| | | | |
|---|---|---|---|
| 6,891,230 B2 | 5/2005 | Yu | |
| 2008/0203534 A1* | 8/2008 | Xu et al. | 257/577 |
| 2011/0176244 A1* | 7/2011 | Gendron et al. | 361/56 |

OTHER PUBLICATIONS

Coffing, D., Analysis of a Zener-Triggered BiPolar EDS Structure in a BiCMOS Technology, IEEE BCTCM 1.2 Sep. 1998.
Wang, A., et al., A Novel Dual-Direction IC EDS Protection Device, Proceedings of 7th IPFA '99, Singapore, Aug. 1999.
U.S. Appl. No. 12/038,146, filed Feb. 27, 2008, Entitled "Resistor Triggered Electrostatic Discharge Protection".

* cited by examiner

*Primary Examiner* — Mary Wilczewski
*Assistant Examiner* — Toniae Thomas
(74) *Attorney, Agent, or Firm* — Sherry W. Schumm

(57) ABSTRACT

Electrostatic discharge (ESD) protection clamps (61, 95) for I/O terminals (22, 23) of integrated circuit (IC) cores (24) comprise a bipolar transistor (25) with an integrated Zener diode (30) coupled between the base (28) and collector (27) of the transistor (25). Prior art variations (311, 312, 313, 314) in clamp voltage in different parts of the same IC chip or wafer caused by prior art deep implant geometric mask shadowing are avoided by using shallow implants (781, 782) and forming the base (28, 68) coupled anode (301, 75) and collector (27, 70, 64) coupled cathode (302, 72) of the Zener (30) using opposed edges (713, 714) of a single relatively thin mask (71, 71"). The anode (301, 75) and cathode (302, 72) are self-aligned and the width (691) of the Zener space charge region (69) therebetween is defined by the opposed edges (713, 714) substantially independent of location and orientation of the ESD clamps (61, 95) on the die or wafer. Because the mask (71, 71") is relatively thin and the anode (301, 75) and cathode (302, 72) implants (781, 782) relatively shallow, mask shadowing is negligible and prior art clamp voltage variations (311, 312, 313, 314) are avoided.

20 Claims, 4 Drawing Sheets

ZENER TRIGGERED ESD PROTECTION

FIELD OF THE INVENTION

The present invention generally relates to semiconductor devices and methods for fabricating semiconductor devices, and more particularly relates to semiconductor devices and integrated circuits incorporating electrostatic discharge (ESD) protection.

BACKGROUND OF THE INVENTION

Modern electronic devices, especially semiconductor (SC) devices and integrated circuits (ICs) are at risk of damage due to excess voltage events. It is well known that SC devices and ICs can be exposed to excess voltage during handling by humans or machines or other circumstances. These occurrences are often referred to in the art as electrostatic discharge (ESD) events. Accordingly, it is commonplace to provide an ESD clamp (voltage limiting device) across the input/output (I/O) and other terminals of such SC devices and IC's. As used herein, the term "integrated circuit" and the abbreviation IC are intended to be interpreted broadly and include any form of multi-element electronic circuit that may be exposed to ESD events and not be limited to those formed on or in a monolithic semiconductor substrate.

FIG. 1 is a simplified schematic diagram of circuit 20 wherein ESD clamp 21 is placed between input-output (I/O) terminal 22 and ground or common terminal 23 of an IC to protect other devices or elements therein, that is, to protect circuit core 24, coupled to the I/O and common terminals 22, 23. Circuit core 24 may contain any type or combination of electronic elements. FIG. 2 is a simplified schematic diagram illustrating internal components of ESD clamp 21, utilizing, for example, bipolar transistor 25, having emitter 26, collector 27, base 28, resistance 29 and Zener diode 30 having terminals 301, 302. When the voltage across terminals 22, 23 rises beyond a predetermined limit, Zener diode 30 turns on, thereby switching transistor 25 into conduction and clamping the voltage across terminals 22, 23 at a level below that capable of damaging circuit core 24.

FIG. 3 shows simplified cross-sectional view 32 of ESD clamp 31 implementing ESD clamp 21 of FIGS. 1-2 in semiconductor substrate 37, according to the prior art. ESD clamp 31 comprises N-type buried layer (NBL) 34, above which lies P-type layer or region 36. P-well region 38 extends from surface 35 into P region 36. N-type sinkers 40 extend from surface 35 to make ohmic electrical contact to NBL 34. N+ regions 42 make ohmic contact to N-type sinkers 40. P+ regions 43 and 45 make ohmic contact to P-well 38. P-well 38 serves as the base of transistor 25 (see FIG. 2). N+ region 44 serves as the emitter of transistor 25. P+ region 45 serves as anode 301 of Zener diode 30 (see FIG. 2) whose cathode 302 is provided by N-type sinker 40 and N+ contact 42. Zener space charge region (abbreviated as "ZSC") 39 is located between P+ region 45, and N-sinker 40 with N+ contact 42. Anode terminal 22 of ESD clamp 31 is coupled to N+ region 42 and cathode terminal 23 of ESD clamp 31 is coupled to N+ region 44. Conventional passivation layer 37 is provided on surface 35.

While such prior art devices are widely used as ESD clamps, they suffer from a number of limitations. Typical limitations are illustrated, for example, in FIG. 4. FIG. 4 shows plot 46 of the current in milliamps between terminals 22, 23 of ESD clamp 31 as a function of the voltage in Volts across terminals 22, 23 for nominally identical clamps, 311, 312, 313, 314, etc., (collectively 31) located in different regions of and orientations on the same IC, and fabricated at the same time using the same mask set and processing steps. It is observed that some of the ESD clamps (e.g., ESD clamps 311, 312) have clamp voltages at 5 milliamps of about 11-12 volts while others on the same chip (e.g., 314) show clamp voltages at 5 milliamps of about 19 volts. This is observed even though ESD clamps 311, 312, 313, 314, etc., are manufactured at the same time using the same mask set on the same substrate and the same processing steps, and would ordinarily be expected to exhibit nearly identical properties no matter where they are located on the IC chip. This variability is undesirable since it can expose some I/O terminals and their associated circuit cores to significantly larger ESD voltages than other parts of the overall IC.

Accordingly, there is an ongoing need to provide improved ESD clamps, especially ESD clamps that operate at more consistent voltages independent of their location and/or orientation in a particular IC. Further, it is desirable that the improved ESD clamps be obtainable without substantial modification of the manufacturing process used for forming the clamps and their associated circuit core of the IC. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

Figure 1:
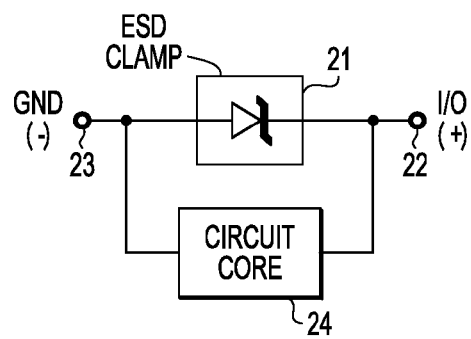
FIG. 1 is a simplified schematic diagram of a circuit wherein an ESD clamp is placed between an input-output (I/O) terminal and a ground or common terminal of an IC to protect other devices on the chip, that is, the "circuit core" coupled to the I/O terminals.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences or arrangements other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as used herein, is defined as directly or indirectly connected in an electrical or non-electrical manner.

As used herein, the term "conductor" should be interpreted broadly to include any type of relatively conductive material. Non-limiting examples are various electrically conductive metals, alloys and mixtures thereof, semi-metals and doped semiconductors. Similarly, the terms "dielectric", "passivating dielectric" and "screen dielectric" and variations thereof should be interpreted broadly to include any type of insulating material and not merely those containing oxygen that may be cited by way of illustration. Non-limiting examples are oxides, nitrides, fluorides, combinations thereof and other organic or inorganic insulating materials. The terms "semiconductor" (abbreviated as "SC") and "semiconductor substrate" are intended to include any type of semiconductor, whether organic or inorganic, to encompass type IV, type III-V, type II-VI and other semiconductor materials and to encompass amorphous, polycrystalline and single crystal materials and combinations thereof, as well as composite or layered arrangements such as for example and not intended to be limiting, semiconductor-on-insulator (SOI) structures. Various embodiments are described herein for silicon semiconductors, but persons of skill in the art will understand that this is merely for convenience of illustration and not intended to be limiting and that any semiconductor material can be used, including those enumerated above. Further, various conductivity type SC regions (e.g., N, N+, P, P+, etc.), device types (e.g., NPN bipolar transistors, P+PN+ Zeners, etc.) and related dopants (e.g., N-type, P-type. etc.) are shown or described in connection with illustrative structures and manufacturing steps. However, these are intended merely for convenience of explanation and not intended to be limiting, and persons of skill in the art will understand that opposite conductivity type devices and regions may be equally well be formed by substituting the opposite conductivity type dopants, so that N type is replaced by P type, P type is replaced by N type and so forth. Accordingly, various regions and dopants may be appropriately referred to as of a "first" conductivity type that can be either N or P type, and others of a "second", opposite, conductivity type that is understood as being either P or N type, respectively.

Figure 3:
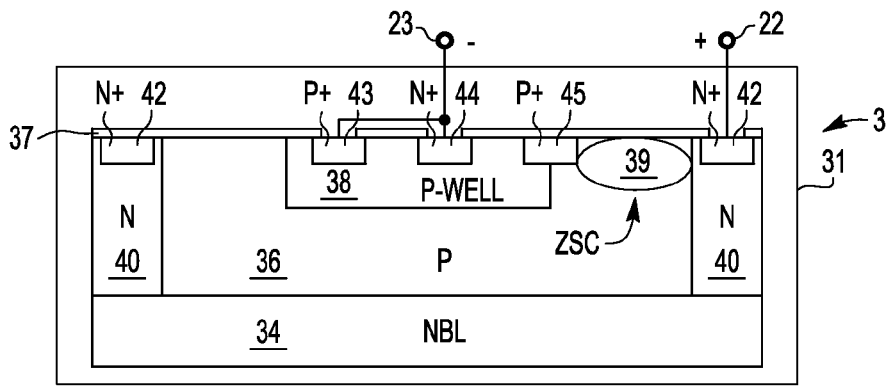
FIG. 3 shows a simplified cross-sectional view of an ESD clamp implemented in a semiconductor substrate and suitable for use in the circuits of FIGS. 1-2, according to the prior art.
Figure 4:
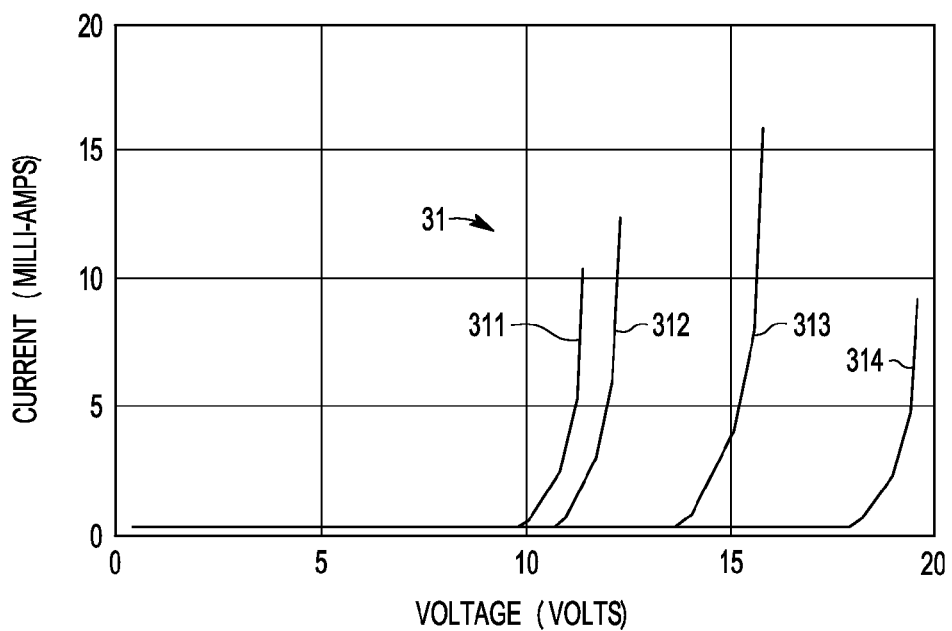
FIG. 4 is a plot of the current through ESD clamps of the type shown in FIG. 3 as a function of the voltage across such ESD clamps for nominally identical individual ESD clamps located in different regions of the same semiconductor die or wafer and manufactured at the same time using the same mask set and processing steps, according to the prior art.
Figure 5:
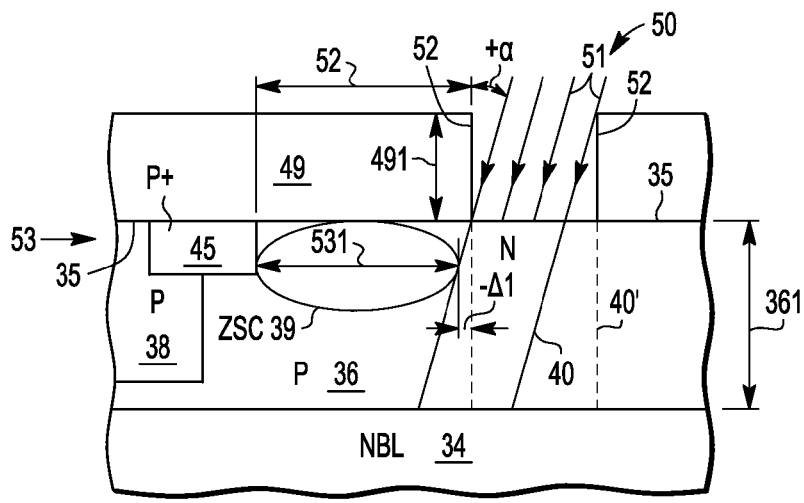
FIGS. 5 and 6 are simplified schematic cross-sectional views of the right hand portion of FIG. 3, somewhat enlarged and during an earlier stage of manufacturing, illustrating how the turn-on voltage variability of FIG. 4 can arise.
Figure 6:
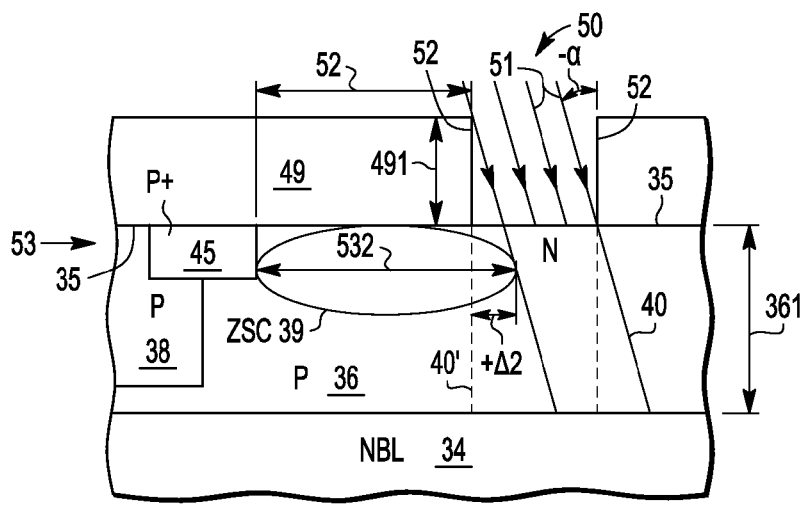

FIGS. 5 and 6 are simplified schematic cross-sectional views 47, 48 of the right hand portion of FIG. 3, somewhat enlarged and during an earlier stage of manufacturing, illustrating conceptually how the turn-on (e.g., clamp) voltage variability of FIG. 4 can arise. In the manufacturing stage being illustrated in FIGS. 5-6, mask 49 of thickness 491 (e.g., ~3-4 micrometers) and having opening 50 has been placed on surface 35 of P-region 36 for the purpose of forming N-type sinker 40 of FIG. 3. Thickness 491 of mask 49 must be substantial in order to block a high energy implant used to form sinkers 40 of sufficient depth to reach NBL 34 through thickness 361 (e.g., ~3-4 micrometers) of P region 36. N-type sinker regions can be formed at any stage of the manufacturing process and not necessarily after the formation of P regions 38, 45, which are included in FIGS. 5-6 to indicate their position relative to sinker 40 being formed. The spacing variations described below are substantially the same independent of the sequence in which the various regions are formed, plus or minus any mask alignment variation. N-type sinker 40 is formed through opening 50, preferably by ion implant 51. If ion implant 51 is performed at angle α with respect to the normal to surface 35, then the lateral width of Zener space charge (ZSC) region 39 will be affected by the magnitude of angle α and thickness 491 of mask 49. This is referred to as the "geometric offset" Δ. For example, if α=0 so that implant 51 is normal to surface 35, then N-type sinker 40' directly underlies opening 50, and ZSC region 39 would have a width approximately equal to distance 52 between where P+ region 45 is located (or will be located) and the mask edge for N-type sinker 40' so that Δ=0. However, if 0<|α|<90 degrees, then the lateral width (e.g., widths 531, 532 in FIGS. 5-6 (collectively width 53) of ZSC region 39 will depend upon whether α is positive or negative and on thickness 491. In FIGS. 5-6, angle α is exaggerated so that the effect of variations in angle α may be more clearly seen. If α is positive (e.g., measured clock-wise) as shown in FIG. 5, then N-type sinker region 40 is tilted toward P+ region 45 within P region 36, effectively shortening width 531 of ZSC region 39 by amount −Δ1, so that width 531 equals distance 52 minus Δ1. Conversely, if α is negative (e.g., measured counter clockwise) as shown in FIG. 6, then N-type sinker region 40 is tilted away from P+ region 45 within P region 36, effectively lengthening width 532 of ZSC region 39 by amount +Δ2, so that width 532 equals distance 52 plus Δ2. When implant 51 is performed, angle α is the same for the semiconductor wafer as a whole. However, the relative azimuthal orientation of the combination of mask openings 50 with edges 52 and adjacent P+ region 45 can vary depending upon the location within a particular die of the wafer since the azimuthal orientation of mask 49 and edges 52 of opening 50 may vary from place to place on the die or wafer. Thus, some ESD clamp structures may be oriented with respect to ion implant 51 as shown in FIG. 5 and others may be oriented as shown in FIG. 6 and some may be at intermediate orientations, depending on their location and azimuthal orientation on the wafer. As a consequence, ESD clamps in different parts of the die (and wafer) can have different ZSC region widths 53, even though they are manufactured simultaneously using the same mask set and process steps. The Zener breakdown voltage and therefore the clamp voltage of ESD clamp 32 depend importantly on ZSC region width 53, thereby accounting for the differences in clamp voltage observed in FIG. 4. It has been found, for example, that the Zener voltage varies by about twenty volts per micrometer change in spacing 53. When angle α has a nominal value of seven degrees and thickness 491 of mask 49 is about 3.6 micrometers, then by simple geometry, offset +Δ2 can have a maximal value of about +Δ2=(3.6)× tan 7°=0.44 micrometers (see FIG. 6) for azimuthal orientation when viewed perpendicular to surface 35, where edges or sides 52 of mask opening 50 are perpendicular to the vertical plane formed by the normal to surface 35 passing through implant beam trace 51 and beam trace 51 (hereafter the "reference plane"). FIGS. 5-6 correspond to the situation where the reference plane is parallel to the plane of FIGS. 5-6 and geometric offset +Δ2 is at its maximum for any given mask thickness 491 and implant angle α. For other azimuthal angles, the geometric offset +Δ2 is reduced, becoming zero when the reference plane is parallel to edges 52 of mask opening 50. Any screen oxide (not shown) underlying mask 49 is assumed to be included in thickness 491 of mask 49. −Δ1 is small (see FIG. 5) since it depends upon the effective depth of the ZSC region 39 and can generally be neglected. The variation in +Δ2 is sufficient to cause a variation in Zener voltage, for example, of up to ΔV~0.44×20~8.8 volts for α=7° and mask thickness 491 of 3.6 micrometers (see FIG. 6). This is the maximal expected variation for this combination of beam angle and mask thickness. The actual variation will depend upon the relative azimuthal orientation of the particular Zener trigger on the die or wafer, having the maximal value when mask edge 52 is perpendicular to the reference plane and zero when mask edge 52 is parallel to the reference plane. This correlates well with the data illustrated in FIG. 4 which shows a gross difference of the clamp voltage at 5 milliamps of about 8.3 volts between the value for clamp 311 and the value of clamp 314. This is believed to explain the observed differences in Zener voltage for different devices at different locations and azimuthal orientation on the wafer during formation of N region 40.

Figure 2:
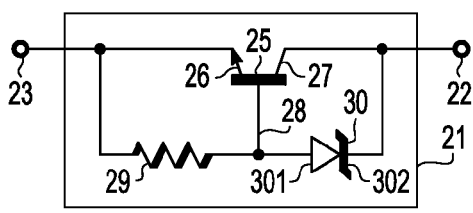
FIG. 2 is a simplified schematic circuit diagram illustrating the internal components of an ESD clamp according to FIG. 1.
Figure 7:
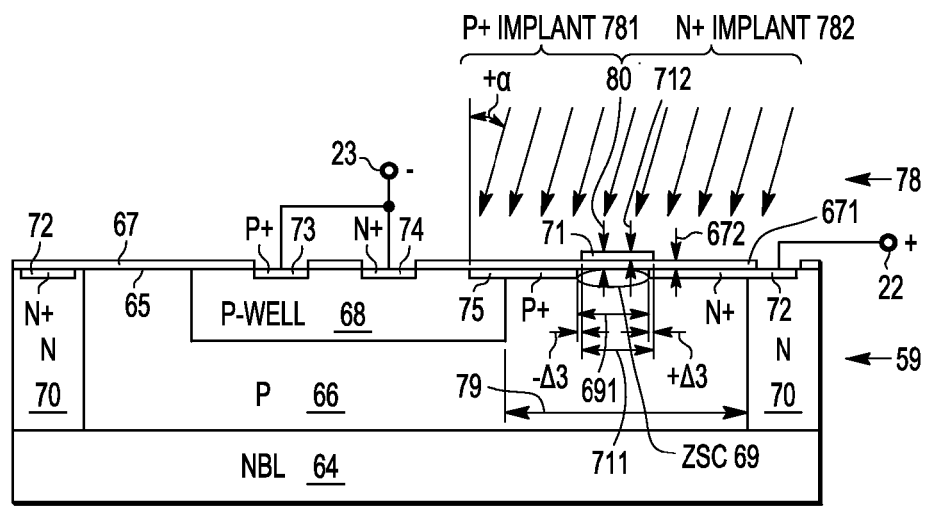
FIG. 7 is a simplified schematic cross-sectional view generally analogous to that of FIG. 3 but of an ESD clamp according to an embodiment of the present invention.

FIG. 7 shows a simplified cross-sectional view through ESD clamp 61 implemented in semiconductor substrate 59 and suitable for use in the circuits of FIGS. 1-2, according to an embodiment of the invention. In the example of FIGS. 7-13, substrate 59 is assumed to be a monolithic single crystal SC substrate, but this is merely to illustrate a preferred arrangement and not to be limiting. As has already been explained, substrate 59 may in further embodiments be other than a monolithic single crystal SC substrate, as for example and not intended to be limiting, it may comprise single crystal, polycrystalline and/or amorphous SC of various types and various conductors and/or insulators and may be homogenous or layered. Silicon is an example of a suitable SC material for inclusion in substrate 59, but as has already been explained, other SC materials and combinations thereof may also be used in additional embodiments. ESD clamp 61 comprises, for example, N-type buried layer (NBL) 64 on which is formed P-type region or layer 66 extending to surface 65. N-type sinkers 70 are provided extending from surface 65 to NBL 64. P-well 68 is formed in P region 66, extending from surface 65. One or more N+ regions 72, 72' are provided in ohmic contact with N-type sinkers 70. P+ regions 73 and 75 are provided in ohmic contact with P-well 68. Referring also to FIG. 2, N+ region 74 in P-well 68 acts as emitter 26 of bipolar transistor 25, P-well 68 forms base 28 of bipolar transistor 25 and NBL 64 (and N-type sinkers 70) act as collector 27 of bipolar transistor 25. P+ region 75 acts as anode 301 and N-type sinker 70 at the right of FIG. 7 with N+ contact 72 acts as cathode 302 of Zener diode 30. Conventional passivation and/or implant screen dielectric (e.g., silicon oxide) layer 67 is desirably provided on surface 65 but may be omitted in other embodiments. Portion 671 of dielectric layer 67 has thickness 672 as described further in connection with FIGS. 8-12. In the illustration of FIG. 7, α is assumed to be about 7 degrees, but this is merely for convenience of description and not intended to be limiting in amount or orientation. Regions 64, 66, 68, 70, 72, 73, 74 of clamp 61 of FIG. 7 are generally analogous to regions 34, 36, 38, 40, 42, 43, 44, respectively, of clamp 32 of FIG. 3, but regions 72 and 75 of device 61 of FIG. 7 are formed in such a way that the clamp voltage variation (see FIG. 4) of device 32 is avoided.

ESD clamp 61 of FIG. 7 differs from ESD clamp 32 of FIG. 3 in that P+ region 75 ohmically coupled to P-type base region 68 and N+ region 72 ohmically coupled to N-type sinker 70 and NBL 64, are used to define Zener space charge (ZSC) region 69, which controls the action of Zener 30 and transistor 25 of FIG. 2, thereby establishing the clamp voltage of ESD device 61. P+ region 75 of depth 751 (see FIG. 10) and N+ region 72 of depth 721 (see FIG. 11) are formed on either side of and self-aligned with mask 71 of width 711 and thickness 712. Thus, single mask 71 and self-aligned implants 781, 782 (collectively 78) on either side of mask 71 are used to define width 691 of ZSC region 69. Portion 671 of screen dielectric 67 of thickness 672 lies between mask 71 and surface 65 of P region 66 of device 61. Portion 671 is desirable but may be omitted in other embodiments. As explained later, one or more blocking masks (e.g., masks 92, 94 of FIGS. 10-11) are used during implant doping to shield those regions of surface 65 into which P+ implant 781 and N+ implant 782 are not desired. This is explained more fully in connection with FIGS. 8-12

The same geometric shadowing effect described in connection with FIGS. 5-6 can still occur in connection with the structure of FIG. 7, but is mitigated by limiting thickness 80 of the combination of screen dielectric 671 and mask 71 and, correspondingly, the energy of implants 78. The smaller thickness 80, the smaller the geometric offset effect. Thickness 80 is the sum of thickness 672 of screen dielectric 671 and thickness 712 of mask 71. Thickness 80 determines the magnitude of the geometric shift −Δ3 to the left of mask 71 and thickness 672 determines the magnitude of the geometric shift +Δ3 to the right of mask 71. It is assumed that implants 78 have sufficient energy to penetrate thickness 672 of screen dielectric 67 (if present) so that thickness 712 of mask 71 determines whether implants 78 will penetrate to surface 35 through the combination of thicknesses 672 and 712. Thickness 712 should be large enough to prevent implants 78 from penetrating to the portion of surface 35 beneath mask 71. If, for example, thickness 80 is about 0.06 micrometers at a beam angle α of about 7 degrees, then the maximum geometric shift Δ3 (where the edge of mask 71 is perpendicular to the reference plane) may be readily calculated in the same way as described in connection with FIGS. 5-6, that is, Δ3=0.06×tan 7°=0.007 micrometers, so that ΔV'~0.007×20~0.15 volts for the maximum clamp voltage variations, an ~98% reduction compared to the maximum clamp voltage variation ΔV=8.8 volts determined for the arrangement of FIGS. 3 and 5-6. The average or mean clamp voltage variation will be about half that value because of the different azimuthal orientations of clamp 61 on substrate 59 during manufacture. If the beam angle α is reduced, the geometric off-set Δ is further reduced, becoming zero at α=0. An angle of α=7° is used in the foregoing examples since it is a commonly encountered implant beam angle, but larger or smaller angles can also be used and the advantages provided by the structure of FIG. 7 compared to the structure of FIGS. 3 and 5-7 will still be obtained for any α>0. Stated another way, it is useful that thickness 80 be about ≦2.0 micrometers, more conveniently about ≦0.5 micrometers and preferably about ≦0.25 micrometers.

The invented embodiment illustrated by FIG. 7 provides a further advantage that is independent of the implant angle α. For example, with the arrangement of FIGS. 3 and 5-7, any variation in alignment of opening 50 in mask 49 with respect to P+ region 45 adds to Δ1 and Δ2. This effect can occur wafer-to-wafer as well as within a wafer. This effect is avoided by the embodiment of the present invention illustrated in FIG. 7 because of the double self-aligned (for P+ and N+ implants) use of single mask 71 for determining width 691 of ZSC region 69. Width 691 is not dependent on any mask alignment tolerances, but only on the width of mask 71 and whatever small geometric (and generally negligible) offset may be inherent due to the finite thickness of screen dielectric region 671 and mask 71 and angle α. This is a significant advance over the prior art.

FIGS. 8-12 are simplified schematic cross-sectional views through a portion of semiconductor wafer 59 at different stages 108-111 of manufacture of ESD clamp 61 of the type illustrated in FIG. 7, according to further embodiments of the present invention. For convenience of description, it is assumed hereafter that ESD clamp 61 is being fabricated using silicon semiconductor material and various conductors and dielectrics compatible therewith, but persons of skill in the art will understand that any semiconductor can be used with appropriate choices of conductors and dielectrics and associated processing steps. Particular formation techniques for the various region of ESD clamp 61 are provided by way of illustration and not limitation and those of skill in the art will understand that many alternative fabrications techniques may also be used. The present invention is not limited by the particular choice of semiconductor material and associated conductors and dielectrics or means for forming them.

Figure 8:
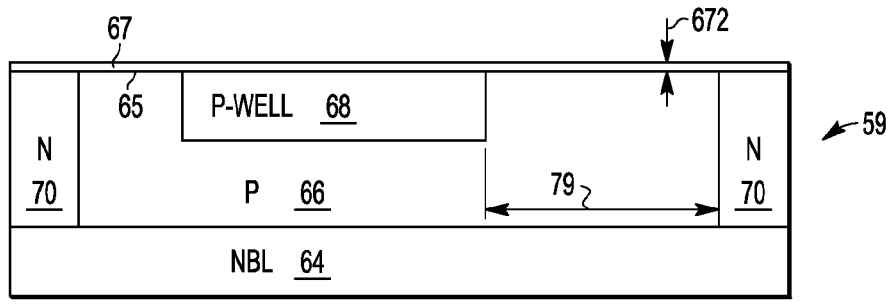
FIGS. 8-12 are simplified schematic cross-sectional views through a portion of a semiconductor wafer at different stages of manufacture of an ESD clamps of the type illustrated in FIGS. 7 and 13, according to further embodiments of the present invention.

Referring now to manufacturing stage 108 of FIG. 8, substrate or wafer 59 of, for example, silicon and having upper surface 65 is provided, in which have already been formed buried layer (BL) 64 of a first conductivity type, typically relatively heavily doped, (e.g., epi-) region 66 of a second opposite conductivity type and lower doping than BL 64 and well-region 68 of the second opposite conductivity type and somewhat higher doping than region 66 but less than BL 64. BL 64 is desirable but may be omitted in other embodiments. In a preferred embodiment, Layer 64 is N-type and is henceforth referred to by way of example as NBL 64, region 66 is P-type and well-region 68 is also P-type, but this is merely for convenience of description and not intended to be limiting. Similarly, N-type sinker regions 70 are formed extending from surface 65 to NBL 64. While it is desirable that regions 70 be deep enough to intercept BL 64, in other embodiments, especially if BL 64 is not present, regions 70 may be shallower and are therefore also appropriately referred to merely as doped regions 70 of a first conductivity type. Dielectric passivation or dielectric screen layer 67 is preferably provided on surface 65. At this stage of manufacture, screen or passivation dielectric layer 67 is desirable but may be omitted in other embodiments. Silicon oxide is preferred for layer 67, but other dielectrics such as have been mentioned previously and combinations thereof may also be used. Further, while reference number 67 is used throughout FIGS. 7-13, for the dielectric passivation or screen layer on surface 35, this is merely for convenience of description and not intended to imply that such layer is maintained undisturbed thought out the various manufacturing stages. In other embodiments, such layer may be modified and/or removed and/or replaced during the manufacturing process. Layer 67 has thickness 672 usefully in the range of about 0.005 to 0.1 micrometers, more conveniently in the range of about 0.005 to 0.05 micrometers, and preferably in the range of about 0.005 to 0.03 micrometers, but larger or smaller values can also be used, consistent with the desire in a preferred arrangement to subsequently implant dopant ions there-through when layer 67 is present. N-type sinker regions 70 may have an annular shape so that the portion at the right of FIG. 8 wraps around to the portion at the left of FIG. 8, but either arrangement is useful, for example, either annularly connected or separately coupled. Regions 64, 66, 68, and 70 are conventional and their lateral dimensions and depth from surface 65 will depend upon the particular properties desired for ESD clamp 61. Values typically found in prior art clamp 31 may be used or other values chosen depending on the needs of the designer. For example: (i) if heavier current conducting capability is desired, larger device area and hence larger lateral dimensions are appropriate; or (ii) if higher or lower clamp voltages are needed, then various different depth and spacing dimensions may be more suitable. Such design variations are within the competence of persons of skill in the art. Structure 208 results.

Figure 9:
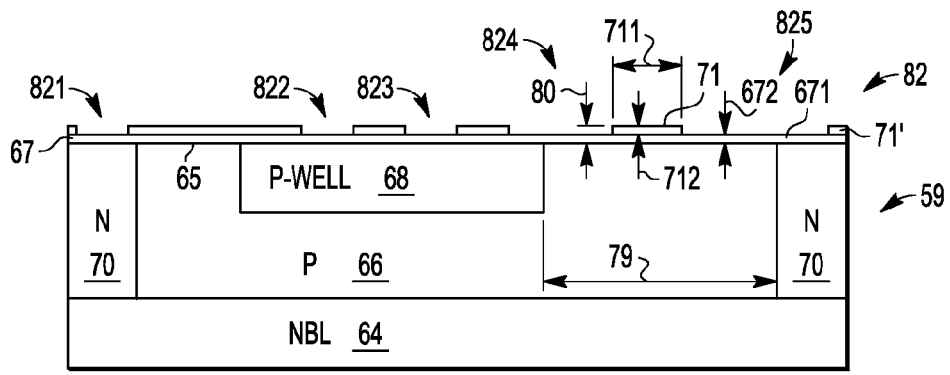

Referring now to manufacturing stage 109 of FIG. 9, structure 208 of FIG. 8 has masking layer 71' of thickness 712 applied on screen or passivating dielectric 67 if present or on surface 65 if layer 67 is absent. For convenience of description layer 67 is included in FIGS. 7-13, but may be omitted in other embodiments. Layer 71' can be of any conductor or dielectric or mask material adapted to adequately mask against dopant ions, as will be subsequently explained. It is desirable that the material of layer 71' have a relatively high density or low dopant diffusion coefficient or both since its function in later manufacturing stages is to mask dopants so that they do not reach certain portions of surface 65 of substrate 59. When ion implantation is used for doping, the implant ion stopping power of a mask layer generally increases as the density of the mask material increases. When thermal doping is used, the diffusion coefficient is important. Polysilicon, silicon oxide, silicon nitride and other refractory dielectrics, semiconductors, conductors and combinations thereof are non-limiting examples of suitable materials for layer 71', but many other materials well known in the art can also be used. While ion implantation is the preferred doping mechanism and is shown herein by way of example, this is not intended to be limiting and other doping means well known in the art may also be used. Openings 821, 822, 823, 824, 825 (collectively 82) are provided extending through layer 71' to underlying layer 67 or SC surface 65. Each of openings 82 corresponds to a region in substrate 59 desired to be subsequently doped. Mask or mask portion 71 of lateral width 711 of layer 71', located toward the right in FIG. 8, will be subsequently used as the self-alignment mask for controlling the width of ZSC region 69 (see FIGS. 7 and 11-12). For ESD clamps 61 with clamp voltage in the range of about 5 to 80 volts, width 711 is usefully in the range of about 0.01 to 1.0 micrometers, more conveniently in the range of about 0.05 to 0.5 micrometers, and preferably in the range of about 0.1 to 0.3 micrometers, but larger or smaller values can also be used, depending upon the clamp voltage desired to be obtained. Structure 209 results.

Figure 10:
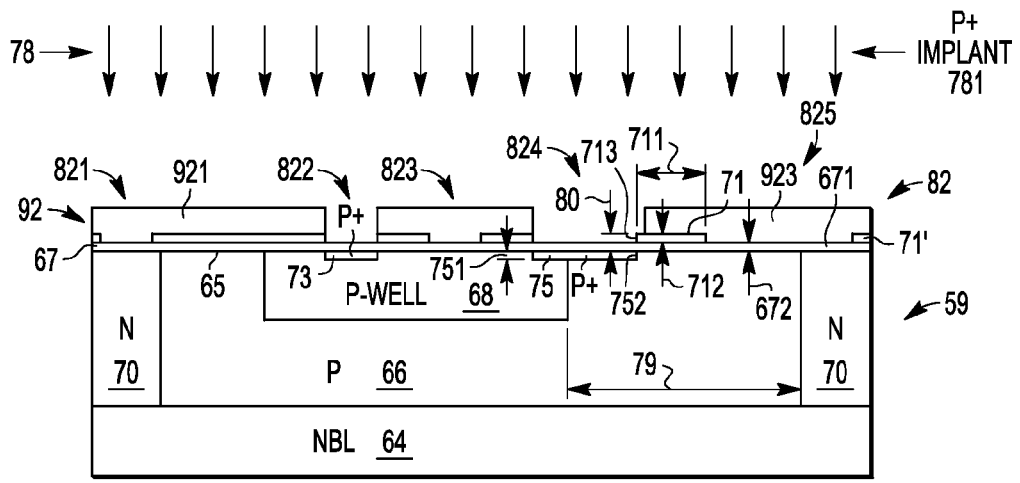

Referring now to manufacturing stage 110 of FIG. 10, structure 209 of FIG. 9 has mask layer 92 applied over mask layer 71'. When ion implantation is being used for doping, photoresist is a suitable material for mask layer 92. Mask layer 92 has portion 921 that blocks opening 821 in layer 71', portion 922 that blocks opening 823 in layer 71' and portion 923 that blocks opening 825 in layer 71'. Openings 822 and 824 are exposed to P+ implant 781. Implant 781 of, for example boron, desirably has a dose and energy sufficient to provide highly doped P+ regions 73 and 75 with depth 751 in the indicated locations. Depth 751 is usefully in the range of about 0.04 to 0.5 micrometers, more conveniently in the range of about 0.05 to 0.3 micrometers, and preferably in the range of about 0.08 to 0.12 micrometers, but larger or smaller values can also be used, consistent with the resistance of such regions desired by the designer and their ability to make efficient ohmic contacts to adjacent regions of the same doping type. For boron, implant energies in the range of about 5 to 10 KeV are useful with about 6 to 9 KeV being more convenient and about 7 KeV being preferred, depending upon the material and thickness of layer 67 if present and the material of substrate 59. If other dopant ions are used, the implant energy should be adjusted to obtain substantially the dopant region thicknesses discussed above. It will be noted that the location of rightward lateral edge 752 of P+ region 75 is determined by leftward edge 713 of mask 71. The leftward edge of opening 824 overlaps P-well region 68 so that ohmic contact of P+ region 75 thereto is obtained. Structure 210 results.

Figure 11:
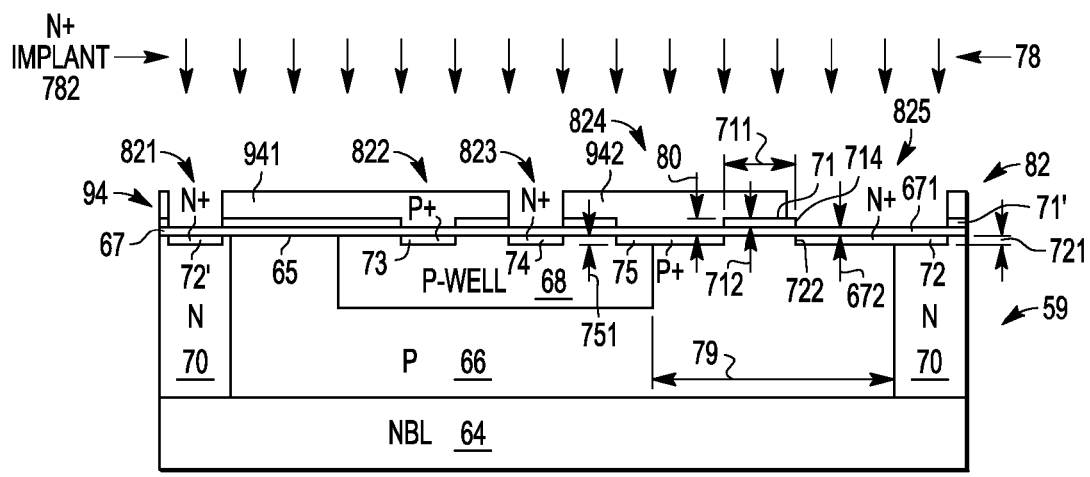

Referring now to manufacturing stage 111 of FIG. 11, mask layer 92 of stage 210 is removed using means well known in the art and replaced with mask layer 94, also conveniently of photoresist when ion implant doping is being used. Mask layer 94 has portion 941 that blocks opening 822 and portion, 942 that blocks opening 824. Openings 821 in mask layer 71' and opening 823 in layer 71' and opening 825 in layer 71' are exposed. N-type implant 782 is conveniently provided through openings 821, 823, and 825. Implant 782 of, for example arsenic, desirably has a dose and energy sufficient to provide highly doped N+ regions 72', 74 and 72 of depth 721 in the indicated locations. Depth 721 is usefully in the range of about 0.02 to 0.5 micrometers, more conveniently in the range of about 0.03 to 0.3 micrometers, and preferably in the range of about 0.04 to 0.08 micrometers, but larger or smaller values can also be used, consistent with the resistance of such regions desired by the designer and their ability to make efficient ohmic contacts to adjacent regions of the same doping type or rectifying and/or injecting contacts with adjacent regions of opposite conductivity type, as desired by the designer. For arsenic, implant energies in the range of about 30 to 50 KeV are useful with about 35 to 45 KeV being more convenient and about 40 KeV being preferred, depending upon the material and thickness of layer 67 if present and of layer 71' (the localized mask) and substrate 59. If other dopant ions are used, the implant energy should be adjusted to obtain substantially the doped region thicknesses discussed above. It will be noted that the location of leftward lateral edge 722 of N+ region 72 is determined by rightward lateral edge 714 of mask 71. Structure 211 results. It will be appreciated that mask 71 provides a double-self-aligning function in that its leftward and rightward edges substantially determine width 691 (see FIG. 7) of ZSC region 69. The geometric off-set effect (e.g., Δ3) discussed earlier and indicated in FIG. 7 is ignored in FIGS. 11 and 12 to avoid unduly cluttering the drawings and because it is so small relative to width 711 of mask portion 71 and in any case has relatively little effect on the clamp voltage because of the comparatively small thickness 80 of mask 71 and surface dielectric layer 67. As noted earlier, the smaller overall mask layer thickness 80, the smaller geometric offset Δ3.

Figure 12:
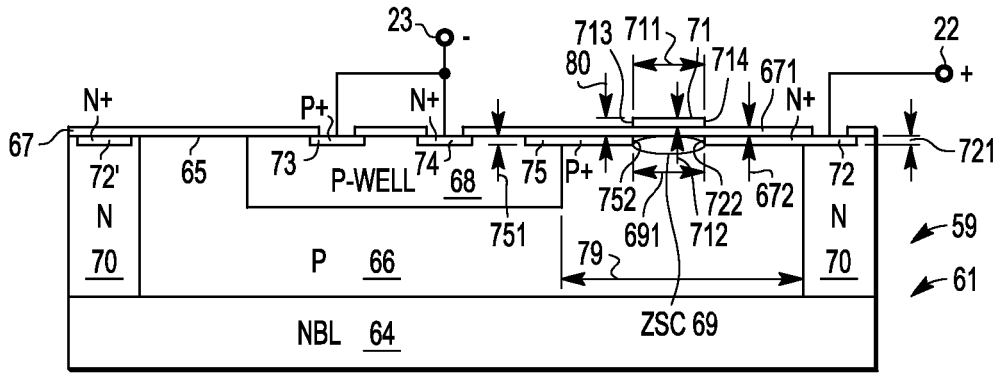

Referring now to manufacturing stage 112 of FIG. 12, mask layer 94 and most or all of layer 71' are removed. Conventional conductive contact 23 is provided to regions 73, 74 and conductive contact 22 is provided to region 72 using means well known in the art. Structure 212 results wherein device 61 of FIG. 7 is substantially completed. Although mask 71 is shown as being left in place in FIGS. 7 and 12, in other embodiments, it may be removed at the same time as the rest of layer 71'. Either arrangement is useful. The prior art geometric off-set effect on clamp voltages is avoided by the arrangement of FIGS. 7-12 wherein a single relatively thin self-alignment mask (e.g., mask 71) is used to determine the separation of edges 752, 722 of doped regions 75, 72 forming the first terminal (e.g., anode) and the second terminal (e.g., cathode) of Zener 30 (see FIG. 2) and therefore the width of ZSC region 69 and implant energies consistent with such relatively thin self-alignment mask are used for forming comparatively shallow doped regions 75, 72 so that azimuthal orientation geometric offset associated with forming doped regions 75, 72 is negligible.

Figure 13:
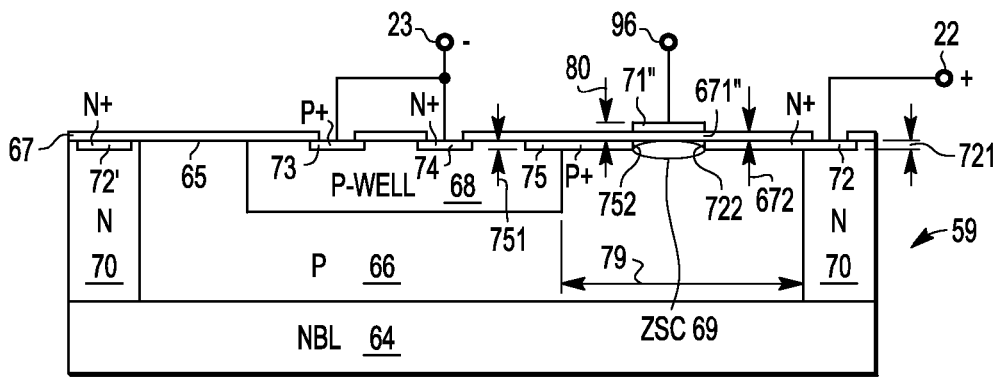
FIG. 13 is a simplified schematic cross-sectional view of an ESD clamp generally analogous to that of FIGS. 7 and 12 but according to a still further embodiment of the present invention.

FIG. 13 is a simplified schematic cross-sectional view of ESD clamp 95 generally analogous to clamp 61 of FIGS. 7 and 12 but according to a still further embodiment of the present invention. Clamp 95 of FIG. 13 differs from clamp 61 of FIGS. 7 and 12 in that mask 71" is formed of a conductive material (e.g., poly silicon) and used both as a mask to define underlying ZSC region 69 and as a control conductor to modify the properties of underlying ZSC region 69. In this situation, portion 671" of dielectric layer 67 should be left in place on surface 65 under conductive mask 71" so that conductive mask 71" is insulated therefrom. When a voltage is applied to control electrode 96 coupled to conductive mask 71", relative to underlying SC region 66, the electric field created thereby extends into the portion of region 66 beneath control conductive mask 71", thereby affecting the carrier distribution within ZSC region 69. This carrier modulation can be used to adjust the voltage between terminals 22, 23 at which ZSC region 69 of clamp 95 (forming Zener 30 of FIG. 2) switches on, thereby turning on transistor 25 and clamping the voltage across terminals 22, 23. This allows the clamp voltage of ESD device 95 to be influenced by an electrical signal applied to terminal 96 after manufacturing is completed rather than relying on the geometry and material properties that can only be modified before manufacturing is completed. This is a significant advance in the art. Further, the use of mask 71, 71" as a double-self-alignment mask is a significant advance in the manufacturing and design art of ESD clamp devices and the IC's of which they are a part, since it mitigates a major cause (e.g., the azimuthal angle dependent geometric mask offset variation) of clamp voltage differences among nominally identical devices located in different portions of a die or wafer.

It will be further noted that the structure and method of the present invention are fully compatible with standard processing steps used in forming the various elements of typical core circuit 24 at the same time and on the same SC die or other substrate. The lateral size of P+ region 75 and N+ region 72 have been exaggerated in FIGS. 7-13 for clarity, while in actual use they can occupy little or no more space than already exists between regions 45 and region 40 in prior art device 31 of FIG. 3. Accordingly, embodiments of the invented arrangement and method do not involve significant changes in the die area occupied by the improved ESD clamp of the present invention or require substantially modified processing steps. Only mask changes are needed. The N+ and P+ doping steps used in forming the improved ESD clamp of the present invention are generally similar to those available for forming source-drain regions in field effect transistors or contact regions in bipolar transistors or other types of devices, which are often found in core circuit 24 intended to be manufactured at the same time as ESD clamps 61, 95 (see FIGS. 7, 12, 13). This is of great utility since it means that the improved ESD clamps of the present invention can be incorporated in IC's without significant additional cost in occupied area or custom manufacturing steps. These are significant advances in the art.

According to a first embodiment, there is provided an electrostatic discharge (ESD) protection clamp (61, 95) having first and second protective terminals (22, 23) adapted to limit a voltage appearing across a circuit core (24) to which the protective terminals (22, 23) are coupled, comprising, a bipolar transistor (25) having an emitter (26, 74) of a first conductivity type coupled to the first protective terminal (23), a collector (27, 64, 70, 72) of the first conductivity type coupled to the second protective terminal (22) and a base (28, 68) of a second, opposite conductivity type located between the emitter (26, 74) and collector (27, 64, 70, 72), an integrated Zener diode (30) having a first Zener terminal (301, 75) of the second conductivity type ohmically coupled to the base (28, 68) and a second Zener terminal (302, 72) of the first conductivity type ohmically coupled to the collector (27, 64, 70, 72), and wherein, the first Zener terminal (301, 75) and the second Zener terminal (302, 72) are formed using a single mask (71, 71") such that separation of facing edges (752, 722) of the first Zener terminal (301, 75) and the second Zener terminal (302, 72) are substantially determined by opposed lateral edges (713, 714) of the single mask (71, 71"). According to a further embodiment, the first Zener terminal (301, 75) is more heavily doped than the base (28, 68). According to a still further embodiment, the second Zener terminal (302, 72) is spaced apart from the first Zener terminal (301, 75) by a further region (69) of the second conductivity type. According to a yet further embodiment, the further region (69) is less heavily doped than the base (28, 68). According to a still yet further embodiment, the ESD clamp (61, 95) further comprises a buried layer (64) of the first conductivity type, underlying the base (28, 68) and coupled to the second Zener terminal (302, 72). According to a yet still further embodiment, the second Zener terminal (302, 72) comprises part of the collector terminal (27, 64, 70, 72). According to another embodiment, the single mask (71") is an electrically conductive material separated from the first (301, 75) and second (302, 72) Zener terminals by an insulating region (671). According to a still another embodiment, the ESD clamp (95) further comprises an electrode (96) adapted to function as a control electrode electrically coupled to the electrically conductive material of the single mask (71"). According to a yet another embodiment, the first (301, 75) and second (302, 72) Zener terminals are formed by ion implantation wherein a space charge region (69) of the integrated Zener diode (30) has a length (691) substantially determined by a width (711) of the single mask (71, 71"). According to a still yet another embodiment, an upper surface of the single mask (71, 71") is separated from a surface (65) a substrate (59) in which the integrated Zener diode (30) is formed by a thickness (80) less than about 2.0 micrometers. According to a yet still another embodiment, the thickness (80) is less than about 0.5 micrometers.

According to a second embodiment, there is provided a method for forming an ESD clamp (61, 95), comprising, providing a supporting substrate (59) having therein a semiconductor layer (66) of a first conductivity type extending to a first surface (65) of the substrate (59), forming a well region (68) of the first conductivity type in a first portion of the semiconductor layer (66) and extending to the first surface (65), forming a doped region (70) of a second, opposite, conductivity type in the semiconductor layer (66) extending substantially to the first surface (65) and laterally spaced apart from the well region (68) by a second portion of the semiconductor layer (66), providing a mask layer (71') having a portion (71) of a predetermined width (711) overlying part of the second portion of the semiconductor layer (66), the portion (71) of the mask layer (71') having a first edge (713) facing toward the well region (68) and a second edge (714) facing toward the doped region (70), using the portion (71) of the mask layer (71'), providing a still further doped region (75) of the first conductivity type having a first portion ohmically coupled to the well region (68) and a first distal edge (752) substantially determined by the first edge (713) of the mask portion (71), and using the portion (71) of the mask layer (71'), providing an additional doped region (72) of the second conductivity type having a first portion ohmically coupled to the doped region (70) and a second distal edge (722) substantially determined by the second edge (714) of the mask portion (71). According to a further embodiment, the method further comprises forming an emitter region (74) of the second conductivity type in the well region (68), spaced apart from the still further doped region (75). According to a still further embodiment, the emitter region (74) is laterally defined by an opening in the mask layer (71'). According to a yet further embodiment, the emitter region (74) and the additional doped region (72) are formed at the same time. According to a still yet further embodiment, the method further comprises forming an ohmic contact region (73) of the first conductivity type in the well region (68). According to a yet still further embodiment, the ohmic contact region (73) is laterally defined by another opening in the mask layer (71'). According to another embodiment, the ohmic contact region (73) and the still further doped region (75) are formed at the same time.

According to a third embodiment, there is provided an ESD clamp (61, 95) having first (23) and second (22) terminals, comprising, a bipolar transistor (25) having an emitter (26) of a first conductivity type coupled to the first terminal (23), a collector (27) of the first conductivity type coupled to the second terminal (22) and a base (28) of a second, opposite, conductivity type, and a Zener diode (30) coupled between the base (28) and the collector (27), the Zener diode (30) having a space charge region (69) between a first doped region (75) of the second conductivity type coupled to the base (28) and a second doped region (72) of the first conductivity type coupled to the collector (22), the space charge region (69) having a substantially predetermined width (691) defined by opposed edges (713, 714) of a single mask (71, 71"). According to a further embodiment, the single mask (71") comprises a conductor coupled to a further terminal (96) and insulated from the space charge region (69) and adapted to modulate a trigger voltage of the Zener diode (30) in response to a voltage applied to the further terminal (96).

While at least one exemplary embodiment and method of fabrication has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for forming an electrostatic discharge (ESD) protection clamp, comprising:
   providing a supporting substrate having therein a semiconductor layer of a first conductivity type extending to a first surface of the substrate;
   forming a well region of the first conductivity type in a first portion of the semiconductor layer and extending to the first surface;
   forming a doped region of a second, opposite, conductivity type in the semiconductor layer extending substantially to the first surface and laterally spaced apart from the well region by a second portion of the semiconductor layer;
   providing a mask layer having a portion of a predetermined width overlying part of the second portion of the semiconductor layer, the portion of the mask layer having a first edge facing toward the well region and a second edge facing toward the doped region;
   using the portion of the mask layer, providing a still further doped region of the first conductivity type having a first portion ohmically coupled to the well region and a first distal edge substantially determined by the first edge of the mask portion; and
   using the portion of the mask layer, providing an additional doped region of the second conductivity type having a first portion ohmically coupled to the doped region and a second distal edge substantially determined by the second edge of the mask portion.

2. The method of claim 1, further comprising, forming an emitter region of the second conductivity type in the well region, spaced apart from the still further doped region.

3. The method of claim 2, wherein the emitter region is laterally defined by an opening in the mask layer.

4. The method of claim 3, wherein the emitter region and the additional doped region are formed at the same time.

5. The method of claim 1 further comprising, forming an ohmic contact region of the first conductivity type in the well region.

6. The method of claim 5, wherein the ohmic contact region is laterally defined by another opening in the mask layer.

7. The method of claim 3, wherein the ohmic contact region and the still further doped region are formed at the same time.

8. A method for forming an electrostatic discharge (ESD) protection clamp having first and second protective terminals adapted to limit a voltage appearing across a circuit core to which the protective terminals are coupled, comprising:
   providing a supporting substrate;
   forming a bipolar transistor on the substrate, wherein the bipolar transistor includes an emitter of a first conductivity type coupled to the first protective terminal, a collector of the first conductivity type coupled to the second protective terminal and a base of a second, opposite conductivity type located between the emitter and collector; and
   forming an integrated Zener diode on the substrate, wherein the integrated Zener diode includes a first Zener terminal of the second conductivity type ohmically coupled to the base and a second Zener terminal of the first conductivity type ohmically coupled to the collector, and wherein, the first Zener terminal and the second Zener terminal are formed through openings on either side of a portion of a single mask such that separation of facing edges of the first Zener terminal and the second Zener terminal are substantially determined by opposed lateral edges of the single mask.

9. The method of claim 8, wherein the first Zener terminal is more heavily doped than the base.

10. The method of claim 8, wherein the second Zener terminal is spaced apart from the first Zener terminal by a further region of the second conductivity type.

11. The method of claim 10, wherein the further region is less heavily doped than the base.

12. The method of claim 8, further comprising forming a buried layer of the first conductivity type, underlying the base and coupled to the second Zener terminal.

13. The method of claim 12, wherein the second Zener terminal comprises part of the collector terminal.

14. The method of claim 8, wherein the single mask is an electrically conductive material separated from the first and second Zener terminals by an insulating region.

15. The method of claim 14, further comprising forming an electrode adapted to function as a control electrode, wherein the electrode is electrically coupled to the electrically conductive material of the single mask.

16. The method of claim 8, wherein the first and second Zener terminals are formed by ion implantation wherein a space charge region of the integrated Zener diode has a length substantially determined by a width of the single mask.

17. The method of claim 8, wherein an upper surface of the single mask is separated from a surface a substrate in which the integrated Zener diode is formed by a thickness less than about 2.0 micrometers.

18. The method of claim 17, wherein the thickness is less than about 0.5 micrometers.

19. A method for forming an electrostatic discharge (ESD) protection clamp having first and second terminals, comprising:
   providing a supporting substrate;
   forming a bipolar transistor on the substrate, wherein the bipolar transistor includes an emitter of a first conductivity type coupled to the first terminal, a collector of the first conductivity type coupled to the second terminal, and a base of a second, opposite, conductivity type; and
   forming a Zener diode on the substrate coupled between the base and the collector, the Zener diode having a space charge region between a first doped region of the second conductivity type coupled to the base and a second doped region of the first conductivity type coupled to the collector, the space charge region having a substantially predetermined width defined by opposed edges of a portion of a single mask.

20. The method of claim 19, wherein the single mask comprises a conductor coupled to a further terminal and insulated from the space charge region and adapted to modulate a trigger voltage of the Zener diode in response to a voltage applied to the further terminal.

* * * * *